United States Patent [19]

Crivello et al.

[11] Patent Number: 4,840,977

[45] Date of Patent: Jun. 20, 1989

[54] POLYMERIC IODONIUM SALTS, METHOD FOR MAKING, AND HEAT CURABLE COMPOSITIONS

[75] Inventors: James V. Crivello, Clifton Park; Julia L. Lee, Schenectady, both of N.Y.

[73] Assignee: General Electric Company, Schenectady, N.Y.

[21] Appl. No.: 103,156

[22] Filed: Oct. 1, 1987

[51] Int. Cl.$^4$ .................... C08G 79/14; C08L 85/00
[52] U.S. Cl. .................... 522/25; 522/15; 522/31; 525/389; 525/420; 525/437; 528/166; 528/169; 528/173; 528/191; 528/295; 528/337; 528/341; 528/347; 528/348
[58] Field of Search .............. 528/347, 295, 173, 166, 528/341, 169, 337, 348, 191; 525/389, 408, 437, 420; 523/451, 460, 459; 522/15, 25, 31

[56] References Cited

U.S. PATENT DOCUMENTS

| | | | |
|---|---|---|---|
| 3,981,897 | 9/1976 | Crivello | 522/31 |
| 4,142,035 | 2/1979 | Idel et al. | 525/437 |
| 4,148,839 | 4/1979 | Fydelor | 525/437 |
| 4,171,424 | 10/1979 | Habermeier et al. | 525/437 |
| 4,173,551 | 11/1979 | Crivello | 528/319 |
| 4,518,676 | 5/1985 | Irving | 522/15 |
| 4,529,490 | 7/1985 | Crivello et al. | 522/31 |
| 4,560,709 | 12/1985 | Berner et al. | 522/15 |

OTHER PUBLICATIONS

Yamada, Y. & Okawara, M., "Syntheses & Reactions of Functional Polymers, LXIII Syntheses of Phenyl Polystyryliodonium Salts", Die Makromolekulare Chemie 152 (1972), pp. 153-162.

Yamada, Y., Kashima, K., & Okawara, M., "Synthesis of Tetrameric Iodonium Ion", Polymer Letters Edition, vol. 14 (1976), pp. 65-71.

Livingston, H. K., Sullivan, J. W. & Musher, J. I., "The Synthesis of Organic Polymers Containing Hypervalent Iodine", J. Polymer Sci.: Part C, No. 22 (1968), pp. 195-202.

Yamada, Y. & Okawara, M., "Syntheses & Reactions of Functional Polymers, LXIV. Reactions of Phenyl Polystyryliodonium Salts", Die Makromolekulare Chemie 152 (1972), pp. 163-176.

Primary Examiner—Veronica P. Hoke
Attorney, Agent, or Firm—William A. Teoli; James C. Davis, Jr.; William H. Pittman

[57] ABSTRACT

Photosensitive iodonium polymers are provided useful as positive photoresists. The iodonium polymers can be converted to polymeric diaryl iodonium polyfluorometal and metalloid salts by a metathesis reaction. These polymeric iodonium polyfluorometal and metalloid salts can be used as a catalyst in combination with a copper compound cocatalyst to make heat curable compositions with cationically polymerizable materials such as an epoxy resin.

15 Claims, No Drawings

POLYMERIC IODONIUM SALTS, METHOD FOR MAKING, AND HEAT CURABLE COMPOSITIONS

REFERENCE TO COPENDING APPLICATIONS

Reference is made to copending application, Serial No. (RD-17,421), Walles et al., for MICROENCAPSULATION METHOD, MICROELECTRONIC DEVICES MADE THEREFROM, AND HEAT CURABLE COMPOSITIONS, filed concurrently herewith and incorporated herein by reference.

BACKGROUND OF THE INVENTION

The present invention relates to photosensitive iodonium polymers and to heat curable cationically polymerizable compositions using such photosensitive iodonium polymers in combination with a copper compound as a cocatalyst.

Prior to the present invention, Y. Yamada and M. Ikawara reported the synthesis of phenyl polystyryliodonium salts having the iodonium structure as a pendant group on the main chain, Macromol. Chem. 152, 153, 163 (1972). H.K. Livingston and J.W. Sullivan, J. Polym. Sci. C., 195 (1968) synthesized polymeric iodonium materials by various procedures including the condensation of a dicarboxylic acid and an organoiodosodiacetate. Additional investigations by Y. Yamada, K. Kashima, and M. Okawara [J. Polym. Sci., Polym. Let. Ed. 14, 65 (1976)] reported the reaction of 4,4'-methylene bis(penyliodoso diacetate) with diphenylmethane resulting in the production of an oligomeric iodonium salt.

The present invention is based on our discovery that high molecular weight resins containing iodonium salt components in the main chain can be made by initially effecting the interfacial polymerization of the diacidhalide of dicarboxydialkyldiphenyliodonium bisulfate of the formula,

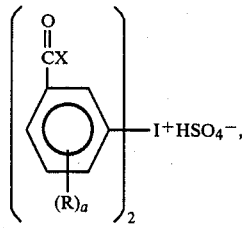

(1)

with diamines, difunctional alcohols, or phenols to produce the corresponding iodonium containing polyamides and polyesters, where R is a $C_{(1-8)}$ alkyl radical, X is a halogen radical, and a is a whole number equal to 0 to 3 inclusive. Polymeric photosensitive iodonium salts are provided comprising chemically combined units of the formula,

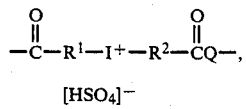

(2)

which can be metathesized with an alkali metal or alkaline earth metal hexafluoro compounds of the formula

 (3)

to produce the corresponding polymeric polyfluoro metalloid iodonium salts, where $R^1$ and $R^2$ are selected from $C_{(6-14)}$ divalent aryl radicals and $C_{(6-14)}$ divalent aryl radicals substituted with 1–4 monovalent radicals inert during interfacial polymerization, Q is a member selected from

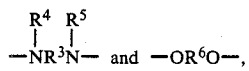

$R^4$ and $R^5$ are the same or different monovalent radicals selected from hydrogen or R radicals, $R^3$ is a divalent $C_{(1-14)}$ hydrocarbon radical or divalent $C_{(1-14)}$ hydrocarbon radical substituted with monovalent radicals inert during interfacial polymerization, $R^6$ is a divalent $C_{(2-30)}$ divalent, sodium, potassium or magnesium, Y is selected from B, P, As and Sb, and n is an integer having a value of 4–6.

STATEMENT OF THE INVENTION

There is provided by the present invention polymeric iodonium salts comprising chemically combined units of the formula,

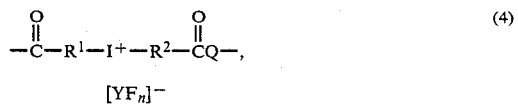

(4)

where $R^1$, $R^2$, Q, Y, and n are as previously defined.

There are included by R, $R^4$, and $R^5$ radicals of formulas (1) and (2), $C_{(1-8)}$ alkyl radicals such as methyl, ethyl, propyl, butyl, pentyl, hexyl, etc. Radicals included within $R^3$ are, for example, divalent alkylene radicals such as methylene, dimethylene, trimethylene, tetramethylene, pentamethylene, hexamethylene; arylene radicals such as phenylene, xylylene, tolylene, naphthylene, anthrylene. $R^1$ and $R^2$ are, for example, arylene radicals included within $R^3$ and such divalent aryl radicals substituted with $C_{(1-4)}$ alkyl, halogen such as chloro, nitro, alkoxy. Radicals included within $R^6$ are, for example, $C_{(1-8)}$ alkylene radicals and $C_{(6-14)}$ arylene radicals, such as phenylene radicals, xylylene, toluene, and divalent radicals of the formula,

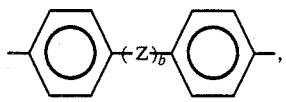

where Z is a divalent radical selected from

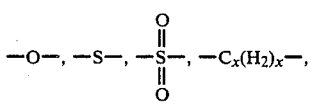

x is an integer equal to 1 to 5, and b is equal to 0 or 1.

In the practice of the invention, the dicarboxydiaryl iodonium bisulfate salts such as shown by formula (1) are initially made by effecting reaction between an alkyl substituted arylcarboxylic acid, such as o-toluic acid and an alkali metal iodate, such as potassium iodate, in the presence of acetic anhydride, sulfuric acid and an inert organic solvent. Typical inert organic solvents are, for example, methylene chloride, chloroform, nitromethane, nitroethane, nitropropane, carbon tetrachloride, and o-dichlorobenzene. The formation of the iodonium bisulfate salt can be effected by maintaining the reaction mixture at a temperature from about −30° to 30° C. during the sulfuric acid addition. After the addition, the mixture can be stirred under ambient temperatures for several days.

Recovery of the iodonium bisulfate salt can be achieved by addition of water to the reaction mixture followed by filtration in accordance with the standard procedures.

Conversion of the dicarboxydiaryliodonium bisulfate salt to the corresponding acid halide can be achieved by use of a halogenating agent, such as thionylchloride in accordance with standard techniques. For example, a mixture of the diaryl iodonium dicarboxylic acid and thionyl chloride can be heated to reflux and hydrogen chloride can be separated.

Intercondensation of the diaryliodonium dicarboxylic halide salt of formula (1) with organic diamine can be achieved in the absence of light and in the presence of an organic solvent and base, while the temperature is maintained at about 0° C. to 60° C. with agitation. Substantially equal molar amounts of the diamine and diaryliodonium dicarboxylic halide can be used. Suitable organic diamines which can be employed in the practice of the present invention to make the iodonium polyamides are compounds included within the formula,

where $R^4$, $R^3$, and $R^5$ are as previously defined. Some of the organic diamines which can be used are, for example, ethylenediamine, 1,6-hexamethylenediamine, 1,3-propanediamine, 1,4-butanediamine, 1,4-cyclohexanediamine, 1,4-phenylenediamine, 1,3-phenylenediamine, toluene-2,4-diamine, 1,4-napthalenediamine, 4,4'-methylenedianiline, 4,4'-oxydianiline, 2,5-dimethylpiperazine, piperazine, and 4,4'-sulfonyldianiline.

In instances where a polyester copolymer is desired, suitable organic dihydroxy compounds can be used, such as HO-$R^6$-OH, where $R^6$ is as previously defined.

Some of the organic dihydroxy compounds are, for example, ethyleneglycol, 1,4-butanediol, 1,3-propanediol, 1,4-cyclohexanediol, 1,6-hexanediol, diethyleneglycol, triethyleneglycol, bishphenol-A, hydroquinone, resorcinol, catechol, 4,4'-oxydiphenol, 4,4'-biphenol, 4,4'-thiobiphenol, 1,4-cyclohexanediomethanol, and neopentylglycol.

It has also been found that in particular instances it can be advantageous to employ aromatic dicarboxylic acid halides, such as phthaloyl chloride, isophthaloyl chloride and terephthaloylchloride as comonomers to improve the solubility of the resulting iodonium salt containing photopolymers in common organic solvents. A proportion of up to 50 mole % of aromatic dicarboxylic acid halide can be used based on total moles of diaryliodonium dicarboxylic halide bisulfate and aromatic dicarboxylic halide to avoid adversely affecting the photo-sensitivity of the resulting copolymer.

The photosensitive iodonium polymer comprising chemically combined units of formula (2) can be metathesized with an alkali metal or alkaline earth metal hexafluoro compound of formula (3).

Reference is made to the method shown by Crivello, U.S. Pat. No. 3,981,897, assigned to the same assignee as the present invention and incorporated herein by reference. The preferred photosensitive iodonium polymers have 0.1 to 10% by weight of antimony based on the weight of photosensitive iodonium polymer.

It has been found that heat curable compositions can be obtained by using the photosensitive iodonium polymer having chemically combined $YF_n$ groups with an effective amount of a copper compound as a cocatalyst to provide heat curable compositions as defined hereinafter. Suitable copper compounds are, for example, copper salts, such as cupric chloride, cuprous sulfate, cupric stearate; copper chelates such as copper acetylacetonate.

The heat curable compositions of the present invention can be made by using an effective amount of cocatalyst with cationically polymerizable organic material. Suitable cationically polymerizable organic materials are, for example, epoxy resins, thermosetting organic condensation resins, vinyl organic prepolymers, cyclic ethers, cyclic amines, lactones, etc.

An effective amount of photosensitive iodonium polymer in the heat curable compositions is an amount sufficient to provide at least 1% by weight of iodine based on the weight of heat curable composition and preferably 1% to 10% by weight of iodine based on the weight of heat curable composition. The copper compound can be used in amounts by weight sufficient to provide 10% to 70% by weight copper, based on the weight of photosensitive iodonium polymer.

The heat curable compositions can be combined with inactive ingredients such as silica, clays, talc, glass fibers, extenders, hydrated alumina, carbon fibers, process aids in amounts of up to 500 parts of filler, per 100 parts of cationically polymerizable organic material.

In order that those skilled in the art will be better able to practice the present invention, the following examples are given by way of illustration and not by way of limitation. All parts are by weight.

EXAMPLE 1

There was added 25 ml of concentrated sulfuric acid drop-wise to a cooled mixture at 0-5° C. of 40.85 grams (0.3 mole) of o-toluic acid, 25.0 grams (0.116 mole) of potassium iodate, 120 ml of methylene chloride, and 50 ml of acetic anhydride. After the addition of the sulfuric acid was completed, the reaction mixture was allowed to stir at room temperature for several days. Then 50 ml of water was added to dissolve the potassium bisulfate formed during the reaction. The resulting methylene chloride layer was separated, and an off-white product was collected by filtration. There was obtained a 19.1 grams of product which, based on method of preparation, was 4,4'-dimethyl-3,3'-dicarboxydiphenyliodonium bisulfate. Examination of the proton NMR spectrum confirmed the identity of the product.

A mixture of 19.1 grams of the above di(3-carboxy-4-methylphenyl)iodonium bisulfate and 70 ml of thionylchloride was heated to reflux and hydrogen chloride gas evolution was observed. Reflux was continued for 5 hours and excess thionylchloride was removed by distillation under reduced pressure. There was obtained a yellow solid which was dried under nitrogen and recrystallized from methylene chloride/diethyl ether to provide 13 grams of a white product. Based on method of preparation, the product was the corresponding diacid chloride of 4,4'-dimethyl-3,3'-dicarboxydiphenyliodonium bisulfate. The identity of the product was confirmed by elemental analysis Calc: % carbon 36.2, % hydrogen 2.26, % iodine 23.9, and % chlorine 13.2; Found: % carbon 36.39, % hydrogen 2.53, % iodine 23.79, and % chlorine 13.16.

EXAMPLE 2

There was added 6.5 grams (0.0123 mole) of 4,4'-dimethyl-3,3'-dichlorocarbonyldiphenyliodonium bisulfate in 10 ml of methylene chloride to a mixture which was stirred consisting of 1.62 grams (0.0145 mole) of trans2,5-dimethylpiperazine in 7 ml of methylene chloride, 5 ml of 5% sodium laurylsulfate solution and 38 ml of ice water containing 0.025 mole of sodium hydroxide. The resulting mixture was allowed to stir for about 12 hours. There was obtained 3 grams of a white product when the mixture was filtered. Based on method of preparation, the product was a poly(amideiodonium bisulfate) consisting essentially of chemically combined units of the formula,

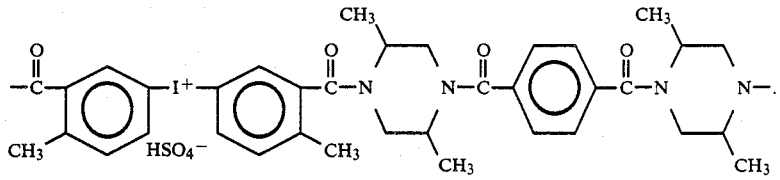

The above procedure was repeated except that there was utilized a methylene chloride solution of 3.25 grams of the 4,4'-dimethyl-3,3'-dichlorocarbonyldiphenyliodonium bisulfate and 1.25 grams of phthaloyl chloride. The reaction mixture was shielded from light and allowed to stir for about 12 hours. During the course of the reaction, the viscosity of the mixture increased. The resulting iodonium polyamide was isolated by pouring reaction mixture into water to provide an oily semisolid which was washed with methanol. There was obtained 1.6 gram of a solid product. Based on method of preparation, the product was an iondonium polyamide having chemically combined units of the formula,

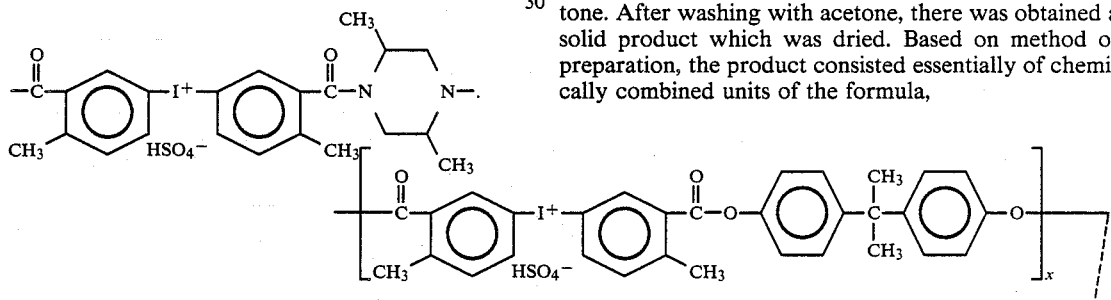

After drying the polymer, it was redissolved in chloroform and cast onto a glass plate. When the solvent had evaporated, the film was subjected to image-wise exposure. Irradiation was performed using a GE H3T7 medium-pressure mercury arc lamp for 5 minutes. The latent image was developed by washing the film with 1,4-dioxane. A clear, positive image of the mask was obtained.

EXAMPLE 4

There was added, under vigorous stirring, 1.3 grams (0.00245 mole) of 4,4'-dimethyl-3,3'-dichlorocarbonyldiphenyl iodonium bisulfate, 0.5 grams (0.00245 mole) of phthaloylchloride and 15 ml of methylene chloride to solution of 1.12 grams (0.0049 mole) bisphenol-A in 30 ml of water containing 0.39 grams (0.0098 mole) of sodium hydroxide and 6 ml of 5% sodium lauryl sulfate solution. The resulting pale yellow solution was stirred overnight and the mixture was then poured into acetone. After washing with acetone, there was obtained a solid product which was dried. Based on method of preparation, the product consisted essentially of chemically combined units of the formula, In accordance with the procedures of Example 3, a film of the product was found to be photosensitive and useful as a photoresist.

EXAMPLE 5

There were added 0.81g (0.0015 mole) 4,4'-dimethyl-3,3'-dichlorocarbonyldiphenyl iodonium bisulfate and 0.31 g (.0015 mole) phthaloyl chloride in 10 ml of methylene chloride to a rapidly stirred mixture consisting of 0.41 g (0.0035 mole) cis,trans-2,5-dimethylpiperazine in 20 ml methylene chloride, 1.25 ml of 5% sodium laurylsulfate solution and 15 ml of ice water containing 0.25g (0.0125 mole) of sodium hydroxide. The resulting mixture was allowed to stir for about 20 hours. The turbid reaction mixture was then poured into water. There was obtained 1.02g of white waxy solid when the mixture was filtered.

The above product was dissolved in 10 ml of dioxane and to it was added 1.0g of sodium hexafluoroantimonate in 5 ml of water. The mixture was heated to 60-70° C. for 3 hours and then poured into water There was obtained 0.5g of polyamide containing iodonium hexafluoroantimonate groups. Elemental analysis showed the polyamide had 3.5% by weight of antimony.

After drying the polymer, a solution of 2% polymer in 4-vinylcyclohexene dioxide was prepared. A thin film was cast onto a glass plate and irradiated with a GE H3T7 medium-pressure mercury arc lamp. The film was cured after a 90 sec UV irradiation.

To the above solution there was added 0.2% of cupric benzoate and the mixture poured into an aluminum pan. A hard cured resin was obtained after heating the aluminum pan at 100° C. for 2 minutes on a hot plate.

Although the above examples are directed to only a few of the very many variables which can be used in the practice of the present invention, it should be understood that the present invention is directed to a much broader variety of photosensitive iodonium bisulfate polymers, such polymers metathesized with metal or metaloid fluoro compound of formula (3), and heat curable and photocurable compositions utilizing such metathesized iodonium bisulfate polymers, as shown in the description proceeding these examples.

What is claimed and sought to be protected by Letters Patent of the United States is as follows:

1. Polymeric iodonium salts comprising chemically combined units of the formula,

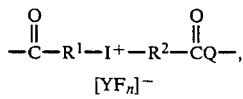

where $R^1$ and $R^2$ are selected from $C_{(6-14)}$ divalent aryl radicals and $C_{(6-14)}$ divalent aryl radicals substituted with 1-4 monovalent radicals inert during interfacial polymerization, Q is a member selected from

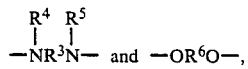

$R^4$ and $R^5$ are the same or different monovalent radicals selected from hydrogen or R radicals, $R^3$ is a divalent $C_{(1-14)}$ hydrocarbon radical or divalent $C_{(1-14)}$ hydrocarbon radical substituted with monovalent radicals inert during interfacial polymerization, $R^6$ is a divalent $C_{(2-30)}$ divalent organo radical, Y is selected from B, P, As and Sb, and n is an integer having a value of 4-6.

2. A polymer iodonium salt in accordance with claim 1, where Q is a

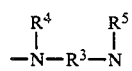

group, $R^1$ and $R^3$ are the same or different monovalent radicals selected from hydrogen or R radicals, and $R^2$ is a divalent $C_{(1-14)}$ hydrocarbon radical.

3. A polymeric iodonium salt in accordance with claim 1, where Q is a $-O-R^6-O-$ group, $R^6$ is a divalent $C_{(2-30)}$ divalent organo radical.

4. A polymeric iodonium salt in accordance with claim 1, where Q is a mixture of cis- and trans-2,5-dimethylpiperazine group.

5. A polymeric iodonium salt in accordance with claim 1, where Q is a bisphenol-A unit.

6. A polymeric iodonium salt in accordance with claim 1, where Q includes chemically combined phthaloyl groups.

7. A polymeric salt in accordance with claim 1, where Y is antimony.

8. A method for making a photosensitive iodonium polymer comprising
   (A) effecting reaction under interfacial reaction conditions between substantially equal molar amounts of a diaryldihalocarbonyl iodonium bisulfate salt of the formula,

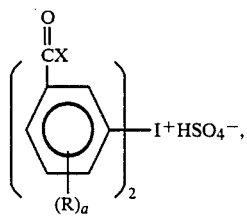

and organic diamine of the formula,

(B) recovering a photosensitive iodonium polyamide from the mixture of (A) where R is a $C_{(1-8)}$ alkyl radical, $R^2$ is a divalent $C_{(1-14)}$ hydrocarbon radical, X is a halogen radical, and a is equal to 0 to 3 inclusive.

9. A method for making a photosensitive iodonium polymer comprising
   (C) effecting reaction under interfacial polymerization conditions between substantial equal molar amounts of a diaryldihalocarbonyl iodonium bisulfate salt of the formula,

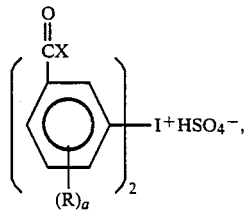

and a dihydroxy organic compound of the formula,

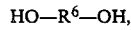

(D) recovering the photosensitive iodonium bisulfate polyester from the mixture of (C), where R is a $C_{(1-8)}$ alkyl radical, $R^6$ is a divalent $C_{(2-30)}$ divalent organo radical, X is a halogen radical, and a is a whole number equal to 0 to 3 inclusive.

10. Heat curable compositions comprising a cationically polymerizable organic material, a polymeric iodonium salt comprising chemically combined units of the formula

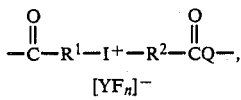
[YF$_n$]$^-$ and an effective amount of a copper compound, where $R^1$ and $R^2$ are selected from C$_{(6-14)}$ divalent aryl radicals and C$_{(6-14)}$ divalent aryl radicals and C$_{(6-14)}$ divalent aryl radicals substituted with 1-4 monovalent radicals inert during interfacial polymerization, Q is a member selected from

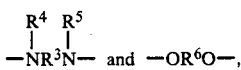

and Y is a metal or metaloid selected from P, As, Sb, B, and $R^6$ is a divalent C$_{(2-30)}$ organo radical.

11. A heat curable composition in accordance with claim 10, where the cationically polymerizable organic material is an epoxy resin.

12. A heat curable composition in accordance with claim 10, where Y is antimony.

13. A photocurable composition comprising a cationically polymerizable organic material and a polymeric iodonium salt comprising chemically combined units of the formula,

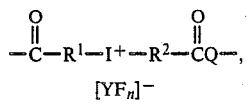
[YF$_n$]$^-$ where $R^1$ and $R^2$ are selected from C$_{(6-14)}$ divalent aryl radicals and C$_{(6-14)}$ divalent aryl radicals and C$_{(6-14)}$ divalent aryl radicals substituted with 1-4 monovalent radicals inert during interfacial polymerization, and Q is a member selected from

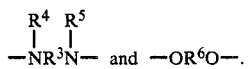

14. A photocurable composition in accordance with claim 13, where the cationically polymeric material is an epoxy resin.

15. A photocurable composition in accordance with claim 13, where Y is antimony.

* * * * *